United States Patent [19]

Lee

[11] Patent Number: 4,987,407
[45] Date of Patent: Jan. 22, 1991

[54] WAFER INTERLEAVING WITH ELECTRO-OPTICAL SAFETY FEATURES

[75] Inventor: Steven N. Lee, Irvine, Calif.

[73] Assignee: Asq. Boats, Inc., Tustin, Calif.

[21] Appl. No.: 319,796

[22] Filed: Mar. 6, 1989

Related U.S. Application Data

[63] Continuation of Ser. No. 185,091, Apr. 22, 1988, abandoned, which is a continuation-in-part of Ser. No. 65,346, Jun. 23, 1987, abandoned.

[51] Int. Cl.$^5$ .............................................. G01B 11/04
[52] U.S. Cl. .................................... 340/540; 340/674; 414/404
[58] Field of Search ................. 340/540, 674, 600; 414/404

[56] References Cited

U.S. PATENT DOCUMENTS

| | | | |
|---|---|---|---|
| 4,493,606 | 1/1985 | Foulke et al. | 414/404 X |
| 4,513,430 | 4/1985 | Vora et al. | 340/674 X |
| 4,568,234 | 2/1986 | Lee et al. | 414/404 |

Primary Examiner—Hezron E. Williams
Assistant Examiner—Joseph W. Roskos

[57] ABSTRACT

A pair of opposed teeth combs hold a first plurality of waters at a first upper location. A lift platform on a machine engageably holds and lifts a second plurality into position to be interleaved into the spaces of the first wafer group. The combs are pivotably mounted such that a skewed water in the group of wafers on one platform comes into contact with a comb and causes the combs to pivot slightly upwardly, or a skewed wafer creates a separation-diminishing force on separated portions of a platform. Moveable suspensions floatably position corners of the separated platform parts relative to each other; and these platform parts react away from an error-initiated contact. Transmitter/receiver units are positioned in optical alignment and a skewed water or a piece of foreign matter causes any one of a plurality of light beams to be broken so that error corrective action is achieved.

6 Claims, 4 Drawing Sheets

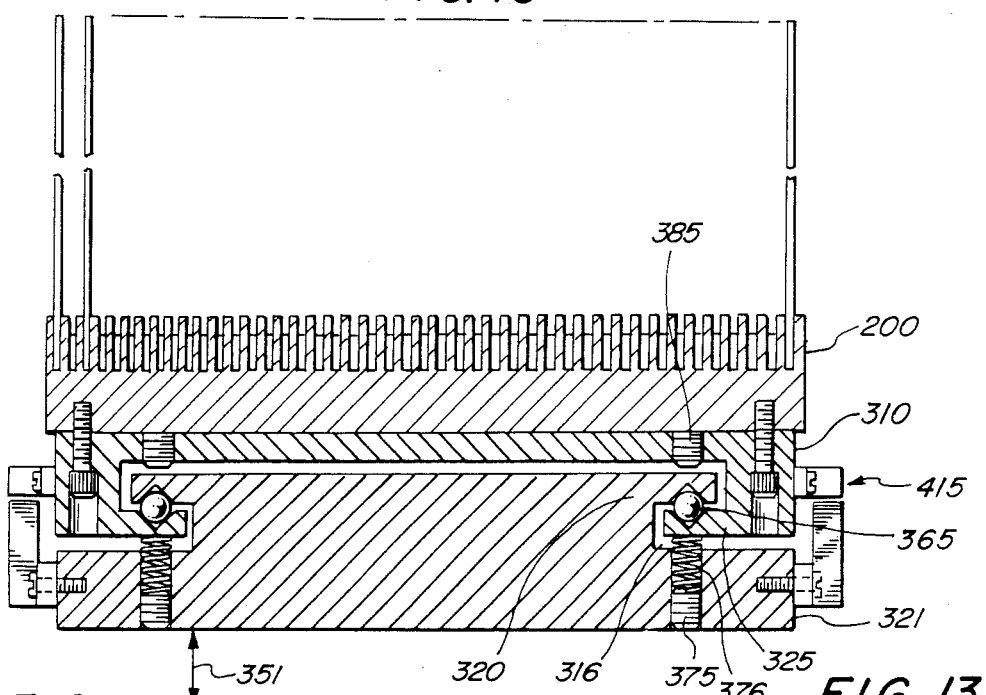
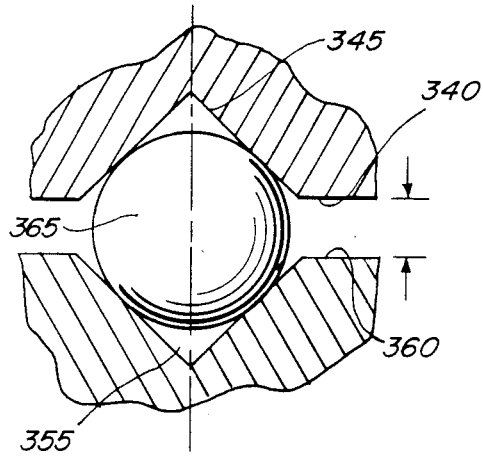
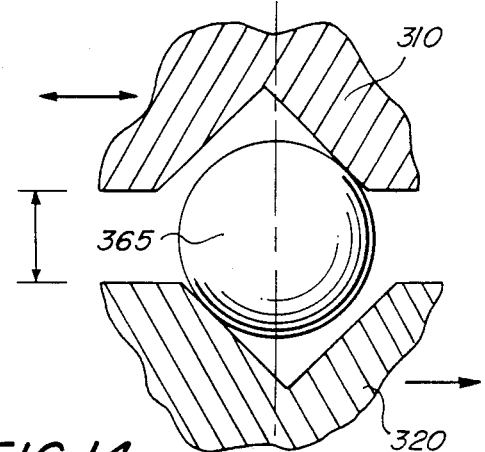
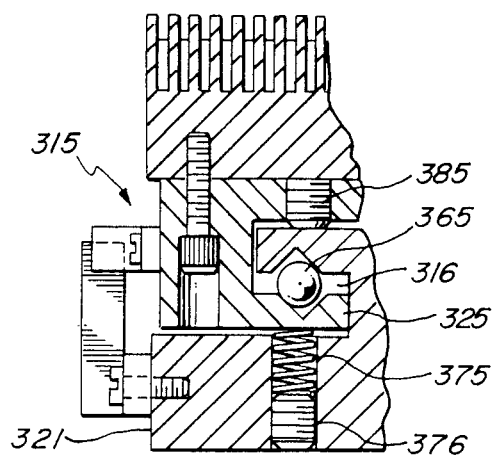
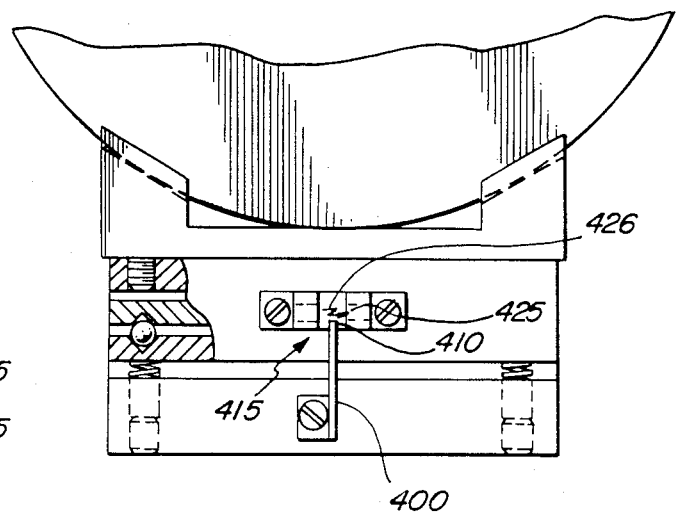

WAFER INTERLEAVING WITH ELECTRO-OPTICAL SAFETY FEATURES

ORIGIN OF THE INVENTION

This application is a continuation of application Ser. No. 07/185091, filed Apr. 22, 1988 which is a continuation-in-part of an application having Ser. No. 07/065,346 filed on June 23, 1987, now abandoned, and assigned to the same assignee as the continuation-in-part. The invention of this application was conceived, made and assigned by a sole inventor to the assignee hereof.

FIELD OF THE INVENTION

This invention relates to automatic wafer interleaving with error-activated electro-optical safety features. More particularly, the invention relates to a novel and unique design of safety features useful in automatic wafer handling machines.

BACKGROUND OF THE INVENTION

Wafer processing requires cleanliness which to a large extent is obtained through automatic operator-controlled wafer handling machines. Typically such machines include a lifting platform and a pair of double-sided combs which are together rotatable so that the combs can pick up a given number of relatively widely-spaced spacers, and can interleave that group with another widely spaced group of wafers. The combs, after the wafer interleaving process is completed, rotate to a new comb position to accommodate all of the interleaved wafers. Interleaved wafers are placed into a quartz boat which is specially designed to hold the interleaved and closely spaced wafers for placement in a high temperature oven for processing.

Since the wafers are thin and fragile, it is important that they do not touch each other, or come into sharp contact with hard objects. Clean Teflon wafer cassettes, for example, may be loaded with about twenty-five wafers at a time. The machine interleaves these twenty-five wafers with another group of twenty-five so that all fifty wafers are closely spaced for loading into the quartz boat. If any wafer is not in its intended pair of opposed comb slots, there is a danger of wafer breakage.

Wafer interleaving involves two carriers or "combs" which space two distinct wafer groups for interleaving into a single larger group. A misaligned wafer can appear at any wafer slot location in either the moveable comb or the stationary comb. That misaligned wafer in one embodiment causes a mechanical movement in one of the carriers in order to activate an error signal that is rapidly interpreted by a computer driven interlacing machine and corrective action is taken. It has been discovered that the location of a misaligned wafer or foreign object creates complex movement problems which may result in breakage and damage of the fragile wafers. Moreover, the two groups of wafers during relative movements must be self-centering into longitudinally offset locations so that neither group touches the other or any solid part of the carriers or machine with sufficient force to cause breakage.

It has been known in the prior art to use a single light beam and a single electro-optical receiver moveably positioned on opposite sides of a plurality of parallel spaced wafers to scan the wafers. The beam's transmitter and receiver move together during scanning so that light passes between the wafers when they are properly spaced. If a wafer is skewed, then the transmitted light beam does not reach the receiver and an error is detected. Such a prior art technique requires scanning of every group and wastes time since the beam must physically move across the group to be scanned. Moreover, wafer misalignment or some foreign matter which is not detectable by the scanning process, can contribute to defects in wafer handling.

This invention improves upon the prior art by employing redundant electro-optical scanning and a plurality of error-initiated safety features.

SUMMARY OF THE INVENTION

A plurality of optical transmitters are fixably positioned in optical alignment with an equal number of optical receivers. The transmitters and receivers are located on opposite sides of a space wherein a plurality of wafers to be scanned are lifted into position by a machine's lifting platform. Light beams pass through the spaces between the wafers when the wafers are properly spaced, but such beams are blocked by a skewed wafer or foreign matter. Failure of light to reach every receiver activates an alarm.

A pair of opposed teeth combs hold a first plurality of wafers at a first upper location. A lift platform on a machine engageably holds a second plurality of spaced wafers into position below the first group. The two groups are longitudinally offset relative to each other for proper interleaving. The lower platform lifts the lower group to cause the individual wafers of the lifted group to be interleaved into the spaces between individual wafers of the first upper group. The combs are pivotably mounted such that a skewed wafer in the group of wafers on the lift platform, comes into contact with a comb and causes the combs to pivot slightly. Such mechnical pivoting activates a safety switch to prevent wafer damage.

Since the location of misalignment (or foreign matter) controls the leverage distance of the pivotable movement, the sensitivity of the error-initiated safety feature, in some instances, becomes a problem. This potential problem is corrected by an improved wafer comb which combines the wafer holding and error-sensing functions in one unitary structure in accordance with another embodiment of this invention. A spring-mounted suspended wafer platform is split into two separated horizontal planes which, in response to an interleaving error, are depressable at the platform's corners in order to activate an electro-optical safety sensing mechanism which monitors the space between the platform's planes. At each corner a rollable ball is adaptable for seating in spaced opposed conical seats to provide, when depressed, relative linear movement of the platform parts. Such linear movement aids in self-centering and also translates into relative vertical movement for activating the safety sensing mechanism.

A light transmitter and a light receiver are positioned in optical alignment above the planar surfaces of a plurality of parallel wafers held by the combs. If a skewed wafer or a piece of foreign matter causes any wafer in the group to move from its normal position in the wafer comb, the beam of light is broken and an alarm is activated.

SUMMARY OF THE DRAWING

FIG. 10 is a cut-away side view depicting a split platform comb carrier of one embodiment of the invention;

FIG. 11 is a cut-away view useful in describing relative linear and vertical movement provided by the invention's spring-loaded ball and conical detent mounting.

FIG. 12 is a cut-away view of the ball and detent showing vertical movement;

FIG. 13 is a cut-away view of the ball and detent showing lateral movement;

FIG. 14 is a partially cut-away end view depicting the error-activating flag and transmitter/receiver assembly of the invention.

DETAILED DESCRIPTION OF THE DRAWING

Figure 1:
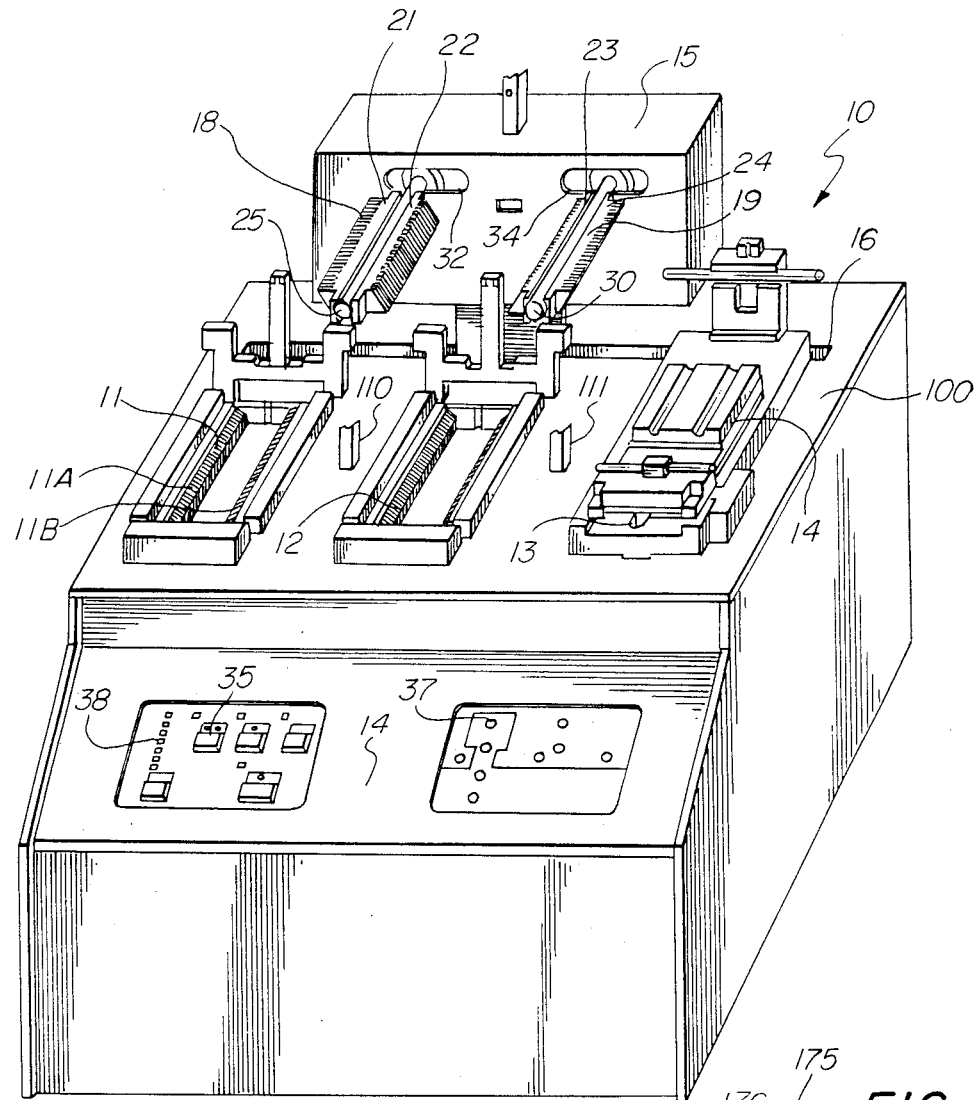
FIG. 1 is a perspective view of a wafer transfer machine adopted with the invention.

FIG. 1 depicts a simplified view of an automatic transfer machine 10 having a plurality of lift stations 11, 12, 13 and a control panel 14. At the rear of machine 10 is a carriage housing 15 which is adapted to travel from side to side in slot 16 across the width of machine 10. Housing 15 includes a pair of opposed comb assemblies 18 and 19. Each comb assembly includes a pair of combs 21, 22 and 23, 24 connected together and fastened to a pair of comb carriage rods 25 and 30. Comb carriage rods 25, 30, under operator control, are rotatable and are adapted to move back and forth within slots 32 and 34 in the carriage assembly 15.

Panel 14 is available to an operator and is provided with a series of buttons and direction controls 35 and 37. An error or alarm light 38 is also present on panel 14. An operator may selected manual or automatic operations as desired. In operation the carriage is first moved to the extreme left hand position, and the spaced-apart comb rods 25 and 30 are located above the left-hand elevator space 11.

Figure 2:
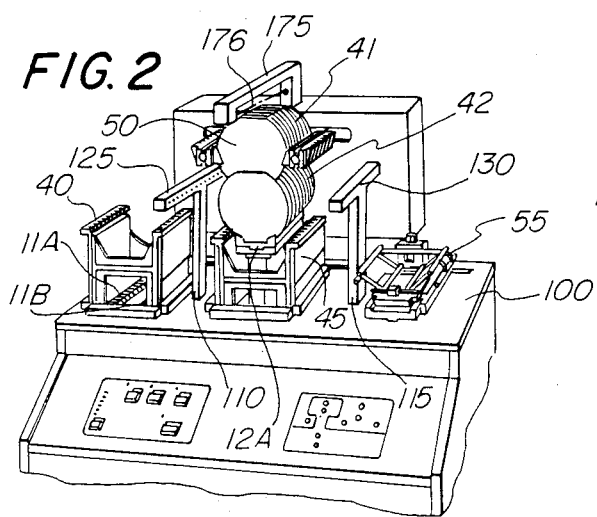
FIG. 2 is a view useful in describing a wafer transfer operation by the machine of FIG. 1.

As shown in FIGS. 1 and 2 a Teflon-coated cassette, 40 having a plurality of parallel grooves adapted to hold a given number of widely spaced wafers 50, is positioned in place above the lift station 11. Lift 11 includes a pair of opposed platform combs 11A and 11B which, upon command, moves up through an opening in the bottom of cassette 40 in order to engage and lift the wafers into an upper position where they can be grasped by carriage comb assemblies 18, 19 (FIG. 1).

As a typical example, assume that cassette 40 has been loaded, either manually or by another machine, with twenty-five wafers. The spacing of these wafers is twice that which is desired for processing by a quartz wafer boat in a wafer furnace. In FIG. 2, the quartz boat 55, shown above lift station 13, is adapted to hold fifty wafers for processing. Above center station 12, FIG. 2, is another Teflon-coated cassette 45 which is adapted to hold another group 42 of twenty-five wafers. The wafers in group 42 are also widely spaced relative to each other and the group with which it is to be interleaved. At the point of machine operation depicted in FIG. 2, the combs and carriage have been manipulated to pick up a group 41 of widely spaced wafers 50, and position that group into an interleaving position over group 42. Lift platform 12A lifts group 42 into an interleaved position with group 41.

Figure 7:
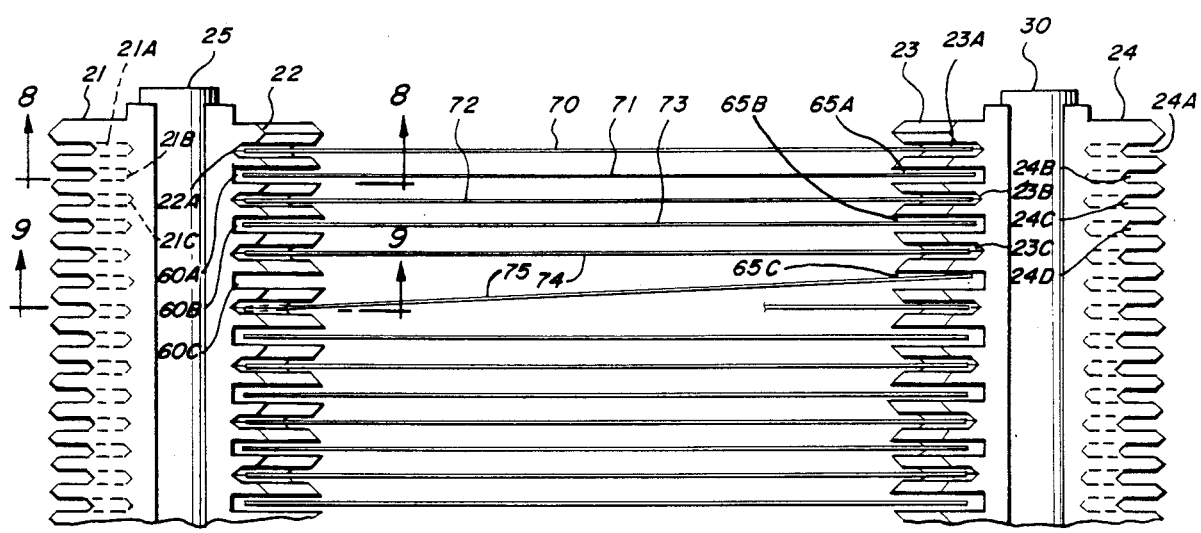
FIG. 7 is a top view showing an opposed pair of combs in a wafer holding position.

A wafer error problem may better be understood by reference to FIG. 7. FIG. 7 is a partial top view taken as though one were looking down on groups 41 and 42 as they are about to be interleaved by machine 10. Rods 25 and 30, in FIG. 7, each include a pair of double faced combs such as 21, 22 on rod 25 and 23, 24 on rod 30. Rods 25 and 30 are capable of rotation through at least 180° so that two different wafer capacities can be handled by carriage 15. Note that inner combs 22 and 23 in FIG. 7 include slots 22A, 22B, etc. which are wider at the top and taper down to a narrower width at their bottom.

Slots 22A, 22B, etc., when positioned below the midpoint of a wafer, hold the wafers in a parallel and spaced upright position for interleaving with another similarly spaced group of wafers. Wafers 70, 72, 74 etc. shown in partial top view are held by opposed slots 22A, 23A, and 22B, 23B, etc. Vertical slots 60A and 65A are located between slots 22A, 22B, 23A, 23B, etc. As shown in FIG. 7, wafer 71 is being moved by platform 12A into a position to be lifted through the cut-out slots 60A and 65A. It is to be understood that wafers 71, 73 etc. are held by carriage 12A and are being lifted into the interleaving spaces between upper wafers 70, 72, etc.

Figure 8:
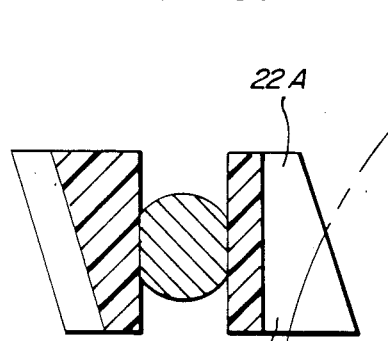
FIG. 8 is a perspective view taken along the line 8—8 in FIG. 7.

FIG. 8 is a side view which is taken along the lines 8—8 of FIG. 7. Wafer 71, in FIG. 8, is shown in both solid and dashed lines as it would appear when platform 12A properly moves wafer 71 into an interleaving position in slot 60A. When all wafers in groups 41 and 42, see FIG. 2, are properly interleaved, then rods 25 and 30 can be moved away from the interleaved group, and rotated about the rod's axis. The outer combs then rotate into an inner comb position. Such combs are slotted with closely spaced slots to hold all fifty interleaved wafers. Note in FIG. 7 that all of the teeth spaces 21A, 21B, etc. on outer comb 21 and 24A, 24B, etc. on outer comb 24 are slanted from wider to narrower at the top and bottom respectively. Such spaces after rotation into the inner position hold all fifty interleaved wafers. Thereafter carriage 15 moves to the extreme right hand position (FIG. 2) where quartz boat 50 is moved upwardly by a lift 14 at station 13 to receive all fifty interleaved wafers then being held by combs 21 and 24. After quartz boat 50 has been fully loaded it is placed into a wafer processing furnace.

Figure 9:
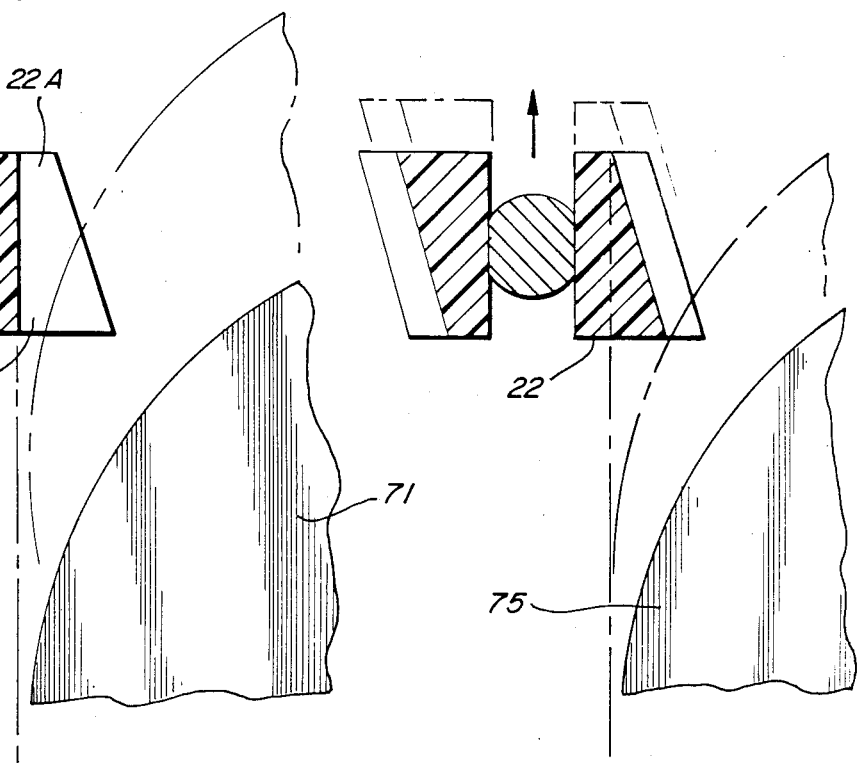
FIG. 9 is a view taken along the lines 9—9 in FIG. 7 and useful in depicting how a skewed wafer causes the comb carriage assembly to pivot.

FIG. 9 is a view taken along lines 9—9 shown in FIG. 7. Wafer 75 is skewed, and does not properly align itself to pass through slots 60C and 65C as shown in the top view of FIG. 7. The side view of FIG. 9 shows that wafer 75 will come into contact with the lower edge of comb 22. In accordance with one feature of this invention, the combs carried by rods 25 and 30 are delicately balanced so that such contact causes the combs and rods to pivot slightly. The pivoting breaks a light beam or otherwise opens a microswitch. The tilting movement of carriage rods 25 and 30 will now be described by reference to FIGS. 4 through 6.

Figure 4:
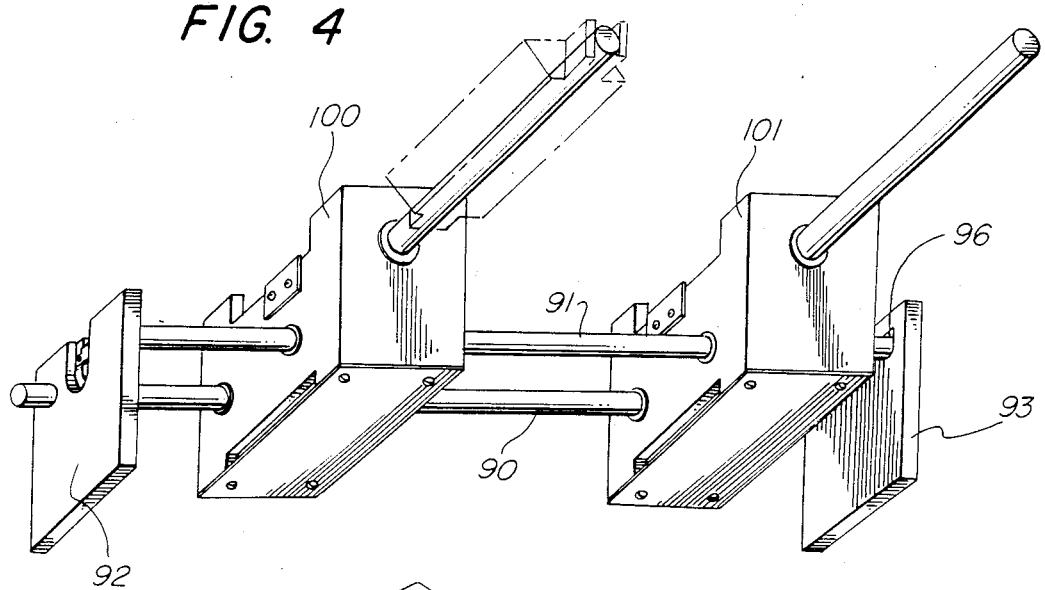
FIG. 4 is a perspective view disclosing the comb's pivotable mounting structure.

FIG. 4 depicts a pair of spaced parallel mounting bars 90, 91 extending between two supports 92, 93 which are mounted in and held by carriage 15. Front bar 91 extends into two u-shaped recesses 95, 96, which are located at the inner front edges of supports 92, 93. Bar 90 is pivotably housed in supports 92, 93. Thus the comb carriages 100 and 101 can pivot upwardly about bar 90 when a wafer such as 75, FIG. 9, touches the bottom of comb 22.

Figure 5:
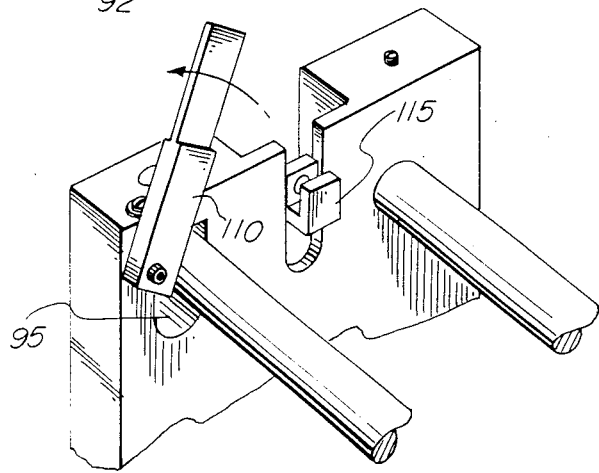
FIG. 5 depicts the electro-optical safety detector of this invention in an activated position.
Figure 6:
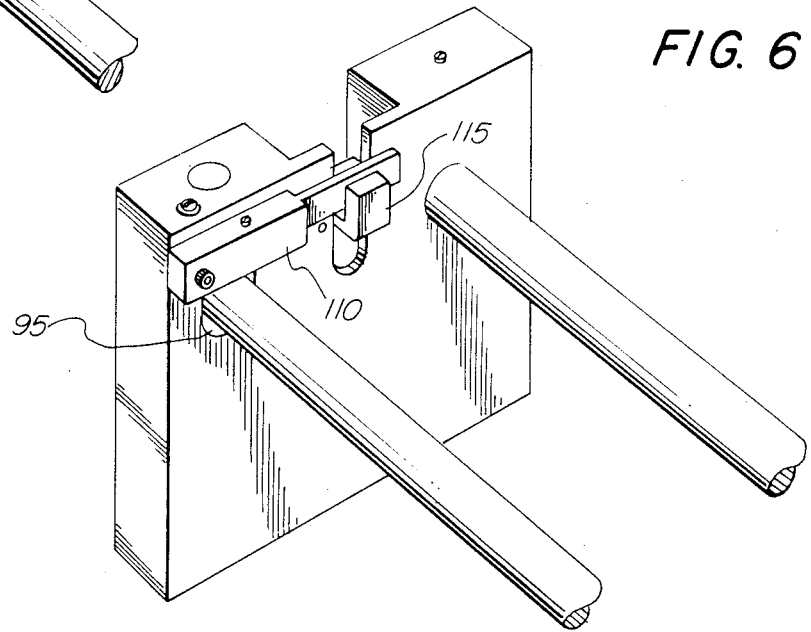
FIG. 6 is a view showing the electro-optical (transmitter/receiver) detector in a normal non-activated position.

Forward bar 91 normally rides near the bottom of recess 95 as shown in FIG. 6. In FIG. 6 bar 91 permits pivotable arm 110 to remain horizontal and microswitch 115 is in a non-activated condition. Microswitch 115 may be, for example, an electro-optical type switch in which a beam of light between a transmitter/receiver pair is blocked by arm 110 when the arm 110 is in the closed position as shown in FIG. 6. Pressure on the lower edge of a comb causes rod 91 to pivot slightly and, thus, as shown in FIG. 5, arm 110 pivots out of its normal closed position and microswitch 115 opens. Microswitch 115 when opened automatically stops any further lifting action and also causes an error alarm such as a light 38. Alternatively, a suitable audible sound in response to microswitch 115, may also be actuated by any known means.

Every wafer is fragile. Contact with a comb surface, such as described and depicted in connection with the dashed lines of FIG. 9, for example, may cause wafer damage. It was discovered that when the amount of pressure required to move arm 110 was set to a very small value, it would be correctly activated by wafer errors at the forefront location. Note that the long moment arm of rods 25 or 30 from a forefront wager misalignemnt would readily trigger the pivotable safety alarm. If, however, a misalignment were to occur toward the rear of a wafer group, the corresponding shorter moment arm would, in some instances, cause wafer damage before sufficient pivot force could be developed to activate the safety alarm.

It was also noted that when the rods began to pivot upward in response to an error, the wafer's interleaving process tended to be further misaligned because the two groups of wafers were not continually moving in spaced parallel vertical planes. These and other potential dangers are avoided by another embodiment of the invention which eliminates the requirement of any pivoting motion, but still rapidly responds to a mechanical change in the position of the wafter handling machine. A mechanical change in the space between separated halves of a wafer platform results in the error-activating safety feature provided by another embodiment of this invention.

FIGS. 10 and 14 respectively depict side and end views of a lift platform 200, which platform in this embodiment is reconfigured and is separated into two opposing horizontal platform surfaces 310 and 320. These two surfaces are provided with novel corner suspension fixtures which promote enhanced centering of two wafer groups for interleaving while still providing an error-initiated safety system.

Although the above-noted embodiment of the invention will be described by reference to the lifting platform of the carrier, it will be readily apparent to those skilled in the art that the stationary carriage could include a split platform and corner suspension fixtures of the invention. Indeed, if still more enhanced sensitivity were desired, the principles of the invention could apply to both platforms, stationary and moveable, keeping in mind that the increase in components and detecting complexity may not warrant the dual mounting of the novel suspension fixtures in both platforms.

The two platform halves 310 and 320 are tortuously juxtaposed along either the sides (or the ends if desired in an alternating configuration) by pairs of spaced tongue and groove ball suspensions 315. A description of one suspension 315 with reference to FIGS. 10 and 11 will suffice since all of them are identical.

A suspension 315 is located at all four corners of the separated halves 310, 320 of lifting platform 200. A groove 316 is recessed in an outer edge 321 of the lower halve 320 of the lifting portion of platform 200. Although not shown in detail in FIG. 10, double-headed arrows 351 symbolically depict that both platform halves 310 and 320 move up and down in unison together as a lifting platform during the interleaving process. Groove 316 is oversized with respect to a tongue 325 which goes into grove 316. Tongue 325 is a downward and inwardly depending portion of platform halve 310.

FIG. 12 depicts the overlapping upper and lower surfaces 340 and 360 of tongue 325 and groove 316. Such overlapping provides a location for a pair of coaxially aligned recessed conical depressions 345 and 355. These conical depressions receive and support a moveable ball 365. The relative thickness of tongue 325, ball 365, and the receiving depressions are selected to form an adjustable clearance space at the equatorial diameter of ball 365.

Spring 375, FIGS. 10 and 11, is located in a bore 376 in edge 321 and is held in a controlled amount of compression by an adjustable set screw 376. Spring 375 urges tongue 325 and ball 365, which it carries, upwardly and with a controlled amount of pressure against the upper overhanging part of groove 316. A space adjustment set screw 385 limits the amount of relative vertical movement that may occur between platform halves 310 and 320. That relative movement keeps ball 365 in position between the two halves while still providing sufficient movement between those halves to accomplish the desired self-centering and safety functions.

The novel suspension at all four corners of the lift platform holds the two halves 310 and 320 together for normal lifting action. As shown the lift platform 200 is properly aligned with an upper comb so that two correctly-loaded wafer groups will be properly aligned for interleaving. FIG. 14 depicts a flag 400 with its upper edge 410 positioned just below a beam of light passing between the transmitter/receiver pair 425. Without any misaligned wafer being present, the entire platform 200 moves up and down as shown by arrows 351, and the beam of light 426 is not blocked by the upper edge 410 of interrupt flag 400. Eletro-optical units 425 are centered at each end of platform 200, FIG. 10. Although such units could be used at other locations, such as at all four corners of the platform, two units 425 are sufficiently sensitive for error detection and rapid correction.

Assuming that a wafer is misaligned, then either a downward, lateral, or combinational force thereof is developed on the separated portions 310, 320 of platform 200. Any such force will result in a diminished separation of the two halves 310 and 320. The light beams in one or more of the units 425 will be interrupted depending upon the pre-determined sensitivity setting for springs 376 if an error occurs.

A lateral force, as shown in FIG. 13, may cause a linear movement between the two halves 310 and 320. In such an instance the opposed conical depressions in which ball 365 is seated actually roll as opposed inclined ramps against the ball's surface. The ramps shown are not to scale and may have to be sloped at a lower angle than that depicted. That ramp motion, in any event, is translated into sufficient separation between the two halves that a safety unit 425 is again activated.

An important point to recognize is that the separated halves 310 and 320 more of less "float" relative to each other and that floating action provides a self-centering feature for the two wafer groups. For example, if a partial misalignment creates a lateral or combined lateral and vertical force, the two halves 310 and 320 respond to that potentially wafer-breaking force by reacting and moving away from the force and thus reducing the chance of wafer damage. A reduction of wafer damage and increased production efficiency is achieved.

FIG. 2 depicts a pair of fixed horizontally-located emitter and receiver arrays 125, 130. These arrays are positioned on upstanding posts 110 and 115 located on the base 100 of machine 10. Each transmitter in array 125 is optically aligned with a corresponding receiver in its opposed array 130. A plurality of individual light beams are positioned to normally pass through the spaces between each pair of properly aligned wafers in group 42 on lift platform 12A and are sequentially gated across the array. When all wafers are properly spaced, all of the sequentially transmitted light beams reach corresponding light receivers. Skewed wafers in group 42, however, block the light beam passage, and an absence of light, when expected at any receiver in array 130, is detected as an error. Detection of an error causes the machine lift 12A to be automatically stopped and an alarm will be activated.

Figure 3:
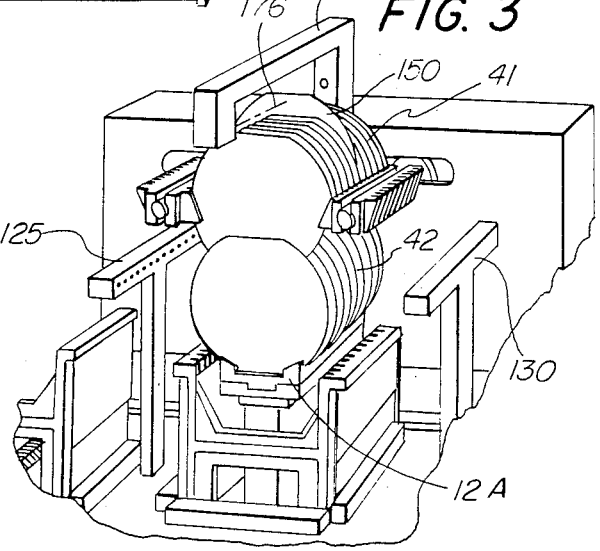
FIG. 3 is a view of a wafer lifted out of its comb slot and breaking an electro-optical beam in accordance with the invention.

FIG. 2 depicts a transmitter-receiver unit 175 in an error-free operation wherein the light beam 176 passes just over the top of the wafers of group 41. FIG. 3 depicts a situation wherein foreign matter or a skewed wafer has caused one wafer 150 to be lifted partially out of combs 22, 23 as lift 12A is moving upwardly. The planar surface of wafer 150 breaks a light beam transmitted from the unit 175.

Although several separate safety features have been described herein, all can be employed individually or in combination to provide redundant safety features. Such redundancy is important. Consider, for example, that a staple or other foreign matter has been inadvertently dropped over the top of two or three wafers in group 42. Such foreign matter may not activate all of the electro-optical safety features (i.e., the foreign matter may not touch the tilting combs). However, mechanical activation of at least one safety feature of this invention is envisioned. For example, the foreign matter may cause one or more wafers to move upwardly, and those wafers will break light beam 176, FIG. 2.

Although a plural station machine has been shown and described, the invention is equally applicable to a single station machine. Various modifications to the embodiments illustrated will be apparent to those skilled in the art without involving any departure from the spirit or scope of the invention.

What is claimed is:

1. A safety device including an alarm for wafer interleaving machine adapted to interleave a group of widely spaced parallel wafers with another group of widely spaced parallel wafers to form closely spaced interleaved wafers from said groups, such safety device comprising:
    first comb means for holding said first group of spaced parallel wafers in a position to be interleaved;
    second comb means holding said second group of spaced parallel wafers and for interleaving said first and second groups together to form one closely spaced group of interleaved wafers;
    means response to an improperly positioned one of said wafers in either group for causing said first comb means to move slightly; and
    means responsive to said comb's movement for activating said alarm.

2. A safety device including an alarm for a wafer interleaving machine adapted to interleave a group of widely spaced parallel wafers with another group of widely spaced parallel wafers to form closely spaced interleaved wafers from said groups, such safety device comprising:
    first comb means for holding said first group of spaced parallel wafers in a position to be interleaved;
    second comb means holding said second group of spaced parallel wafers and for interleaving said first and second groups together to form one closely spaced group of interleaved wafers; and
    means responsive to mechanical movement of any one of the wafers in either group resulting from an improperly aligned wafer for activating said alarm.

3. A safety device including an alarm for a wafer interleaving machine adapted to interleave a group of widely spaced parallel wafers with another group of widely spaced parallel wafers to form closely spaced interleaved wafers from said groups, such safety device comprising:
    first comb means for holding said first group of spaced parallel wafers in a position to be interleaved;
    second comb means holding said second group of spaced parallel wafers and for interleaving said first and second groups together to form one closely spaced group of interleaved wafers;
    electro-optical sensing means for simultaneously scanning all parallel spaces while they are moving in said second group; and
    means responsive to a blockage in any of said spaces as caused by a skewed wafer or foreign matter, for activating an alarm.

4. A safety device including a damage avoidance alarm for a wafer interleaving machine adapted to interleave a group of widely spaced parallel wafers with another group of widely spaced parallel wafers to form closely spaced interleaved wafers from said groups, such safety device comprising:
    first comb means for holding said first group of spaced parallel wafers in a position to be interleaved;
    second comb means holding said second group of spaced parallel wafers for interleaving with said first and second groups to form one closely spaced group of interleaved wafers;
    said second comb means being formed by two separated parts which move relative to each other in response to an improperly positioned one of said wafers in either group for causing a diminishment in said separated space; and means responsive to said diminishment for activating said alarm.

5. A mechanically-activated electro-optical safety device for a wafer interleaving machine adapted to interleave a group of widely spaced parallel wafers with another group of widely spaced parallel wafers to form closely spaced interleaved wafers from said groups, such safety device comprising:

first means for holding said first group of spaced parallel wafers in a position to be interleaved with a second group;

second means holding said second group of spaced parallel wafers moveable relative to said first group for interleaving said first and second groups together to form one closely spaced group of interleaved wafers; and means responsive to a mechanical movement in either wafer holding means caused by an improperly aligned wafer for activating electro-optical safety device.

6. A safety device including an alarm for a wafer interleaving machine adapted to interleave a first group of spaced parallel wafers held in a position to be interleaved with another group of spaced parallel wafers to form a more closely spaced interleaved wafers set, such safety device comprising:

separated holding means supporting either group of spaced parallel wafers as said groups are moved relative to each other for interleaving said first and second groups together; and electro-optical sensing means positioned relative to said separated holding means and responsive to a blockage in any of said spaced wafers as caused, for example, by a skewed wafer or foreign matter, for activating said alarm.

* * * * *